United States Patent
Slade et al.

(10) Patent No.: US 11,101,060 B2
(45) Date of Patent: Aug. 24, 2021

(54) PARTIALLY-INSULATED HTS COILS

(71) Applicant: Tokamak Energy Ltd, Oxfordshire (GB)

(72) Inventors: Robert Slade, Abingdon (GB); Marcel Kruip, Abingdon (GB); Bas van Nugteren, Abingdon (GB); Greg Brittles, Abingdon (GB); Enrique Ruiz de Villa Valdés, Oxford (GB); Rod Bateman, Abingdon (GB); Alun Down, Abingdon (GB)

(73) Assignee: Tokamak Energy Ltd, Abingdon (GB)

( * ) Notice: Subject to any disclaimer, the term of this patent is extended or adjusted under 35 U.S.C. 154(b) by 0 days.

(21) Appl. No.: 16/965,785

(22) PCT Filed: Jan. 31, 2019

(86) PCT No.: PCT/GB2019/050275
§ 371 (c)(1),
(2) Date: Jul. 29, 2020

(87) PCT Pub. No.: WO2019/150123
PCT Pub. Date: Aug. 8, 2019

(65) Prior Publication Data
US 2020/0365304 A1 Nov. 19, 2020

(30) Foreign Application Priority Data

Feb. 1, 2018 (GB) ..................... 1801621
Jul. 25, 2018 (GB) ..................... 1812119
Nov. 19, 2018 (GB) ..................... 1818817

(51) Int. Cl.
*H01F 6/06* (2006.01)
*H01F 27/28* (2006.01)
(Continued)

(52) U.S. Cl.
CPC ........... *H01F 6/06* (2013.01); *H01F 27/2871* (2013.01); *H01F 27/323* (2013.01); *H01F 41/048* (2013.01); *H01L 39/16* (2013.01)

(58) Field of Classification Search
CPC ...... H01F 6/06; H01F 27/323; H01F 27/2871; H01F 41/048; H01L 39/16
See application file for complete search history.

(56) References Cited

U.S. PATENT DOCUMENTS

2009/0286685 A1  11/2009  Kramer et al.
2014/0211900 A1*  7/2014  Kingham ................. H05H 1/12
                                          376/133

FOREIGN PATENT DOCUMENTS

CN      107248444 A    10/2017
EP      0921535 A2     6/1999
(Continued)

OTHER PUBLICATIONS

International Preliminary Report on Patentability for Application No. PCT/GB2019/050275 dated Aug. 4, 2020 (10 pages).
(Continued)

*Primary Examiner* — Paul A Wartalowicz
(74) *Attorney, Agent, or Firm* — Michael Best & Friedrich LLP

(57) ABSTRACT

A high temperature superconducting, HTS, field coil. The HTS field coil comprises a plurality of turns and a partially insulating layer. The plurality of turns comprises HTS material and metallic stabilizer. The partially insulating layer separates the turns, such that current can be shared between turns via the partially insulating layer. The partially insulating layer comprises an electrically conducting layer, and first and second insulating layers. The electrically conducting layer is coated on one side with the first insulating layer and on the other side with the second insulating layer. Each insulating layer has one or more windows through
(Continued)

which electrical contact can be made between the turns and the electrically conducting layer. The windows in the first insulating layer are offset in the plane of the electrically conducting strip from the windows in the second insulating layer.

26 Claims, 10 Drawing Sheets

(51) Int. Cl.
    *H01F 27/32* (2006.01)
    *H01F 41/04* (2006.01)
    *H01L 39/16* (2006.01)

(56) References Cited

FOREIGN PATENT DOCUMENTS

| JP | 2016039289 | A  | 3/2016  |
|----|------------|----|---------|
| WO | 2016064069 | A1 | 4/2016  |
| WO | 2017039299 | A1 | 3/2017  |
| WO | 2017193011 | A1 | 11/2017 |
| WO | 2017218801 | A1 | 12/2017 |

OTHER PUBLICATIONS

International Search Report and Written Opinion for Application No. PCT/GB2019/050275 dated Jun. 12, 2019 (16 pages).
Search Report issued by the United Kingdom Intellectual Property Office for Application No. 1818817.7 dated May 9, 2019 (5 pages).
Search Report issued by the United Kingdom Intellectual Property Office for Application No. 1801621.2 dated Aug. 24, 2018 (4 pages).
Wang et al., "Influence of turn-turn resistivity and coil geometrical size on charging characteristics of no-electrical-insulation REBCO pancake coils," Superconductor Science and Technology, 2016, vol. 29, No. 7, pp. 75006 (1-10).
Lee et al., "The effect of co-wound Kapton, stainless steel and copper, in comparison with no insulation, on the time constant and stability of GdBCO pancake coils," Superconductor Science and Technology, 2014, vol. 27, No. 6, pp. 65018 (1-8).
Song et al., "Dynamic response of no-insulation and partial-insulation coils for HTS wind power generator," IEEE Transactions on Applied Superconductivity, 2015, vol. 25, No. 3, pp. 5202905 (1-5).

* cited by examiner

PARTIALLY-INSULATED HTS COILS

FIELD OF THE INVENTION

The present invention relates to HTS magnets.

BACKGROUND

The challenge of producing fusion power is hugely complex. Many alternative devices apart from tokamaks have been proposed, though none have yet produced any results comparable with the best tokamaks currently operating such as JET.

World fusion research has entered a new phase after the beginning of the construction of ITER, the largest and most expensive (c15bn Euros) tokamak ever built. The successful route to a commercial fusion reactor demands long pulse, stable operation combined with the high efficiency required to make electricity production economic.

These three conditions are especially difficult to achieve simultaneously, and the planned programme will require many years of experimental research on ITER and other fusion facilities, as well as theoretical and technological research. It is widely anticipated that a commercial fusion reactor developed through this route will not be built before 2050.

To obtain the fusion reactions required for economic power generation (i.e. much more power out than power in), the conventional tokamak has to be huge (as exemplified by ITER) so that the energy confinement time (which is roughly proportional to plasma volume) can be large enough so that the plasma can be hot enough for thermal fusion to occur.

WO 2013/030554 describes an alternative approach, involving the use of a compact spherical tokamak for use as a neutron source or energy source. The low aspect ratio plasma shape in a spherical tokamak improves the particle confinement time and allows net power generation in a much smaller machine. However, a small diameter central column is a necessity, which presents challenges for design of the plasma confinement magnet. High temperature superconductor (HTS) field coils are a promising technology for such magnets.

Another potential use of HIS magnets is in proton beam therapy devices. Proton beam therapy (PBT, also known as proton therapy) is a type of particle therapy used in the treatment of cancers (and other conditions which respond to radiotherapy). In PBT, a beam of protons is directed towards the treatment location (e.g. the tumour).

Another, similar therapy is proton boron capture therapy (PBCT), in which boron-11 is introduced to the target location, and a proton beam is used to initiate the $p+^{11}B \rightarrow 3\alpha$ reaction. The same apparatus can be used to provide proton beams for either PBT or PBCT.

The proton beams for PBT and PBCT are generated by particle accelerators such as a cyclotrons or linear accelerators. Accelerators typically used for PBT and PBCT typically produce protons with energies in the range of 60 to 250 MeV, with the most powerful currently operating facility having a maximum energy of 400 MeV.

There are, broadly speaking, two types of design for PBT devices which allow variation of the beam angle. In the first type of design, as illustrated in FIG. 7, the accelerator 3001 is mounted on a gantry 3002, which allows it to be rotated around the patient 3003 (usually about a horizontal axis). The patient is placed on a moveable bed 3004, which provides further degrees of freedom (e.g. translational motion and rotation about a vertical axis).

The second type of design is illustrated in FIG. 8. The accelerator 4001 is stationary, and the beam is directed to the patient via steering magnets 4002 (generally including both quadrupole and dipole magnets), at least some of which are located on a gantry 4003, such that the beam can be rotated around the patient 4004 (e.g. about a horizontal axis). The patient is placed on a moveable bed 4005.

Either design requires that the gantry hold electromagnets capable of steering protons at the beam energy, which could be as high as 400 MeV. This requires very high magnetic fields, and as such the use of HTS magnets can considerably reduce the mass and size of the electromagnets and the gantry needed to move them. HTS magnets may be used within the accelerator, quadrupole magnets of the steering magnets, or dipole magnets of the steering magnets.

Superconducting materials are typically divided into "high temperature superconductors" (HIS) and "low temperature superconductors" (LTS). LTS materials, such as Nb and NbTi, are metals or metal alloys whose superconductivity can be described by BCS theory. All low temperature superconductors have a critical temperature (the temperature above which the material cannot be superconducting even in zero magnetic field) below about 30K. The behaviour of HIS material is not described by BCS theory, and such materials may have critical temperatures above about 30K (though it should be noted that it is the physical differences in composition and superconducting operation, rather than the critical temperature, which define HIS and LTS material). The most commonly used HIS are "cuprate superconductors"-ceramics based on cuprates (compounds containing a copper oxide group), such as BSCCO, or ReBCO (where Re is a rare earth element, commonly Y or Gd). Other HIS materials include iron pnictides (e.g. FeAs and FeSe) and magnesium diborate ($MgB_2$).

ReBCO is typically manufactured as tapes, with a structure as shown in FIG. 1. Such tape 100 is generally approximately 100 microns thick, and includes a substrate 101 (typically electropolished hastelloy approximately 50 microns thick), on which is deposited by IBAD, magnetron sputtering, or another suitable technique a series of buffer layers known as the buffer stack 102, of approximate thickness 0.2 microns. An epitaxial ReBCO-HTS layer 103 (deposited by MOCVD or another suitable technique) overlays the buffer stack, and is typically 1 micron thick. A 1-2 micron silver layer 104 is deposited on the HTS layer by sputtering or another suitable technique, and a copper stabilizer layer 105 is deposited on the tape by electroplating or another suitable technique, which often completely encapsulates the tape.

The substrate 101 provides a mechanical backbone that can be fed through the manufacturing line and permit growth of subsequent layers. The buffer stack 102 is required to provide a biaxially textured crystalline template upon which to grow the HIS layer, and prevents chemical diffusion of elements from the substrate to the HIS which damage its superconducting properties. The silver layer 104 is required to provide a low resistance interface from the ReBCO to the stabiliser layer, and the stabiliser layer 105 provides an alternative current path in the event that any part of the ReBCO ceases superconducting (enters the "normal" state).

In addition, "exfoliated" HTS tape can be manufactured, which lacks a substrate and buffer stack, and instead has silver layers on both sides of the HTS layer. Tape which has a substrate will be referred to as "substrated" HTS tape.

HTS tapes may be arranged into HTS cables. An HTS cable comprises one or more HTS tapes, which are connected along their length via conductive material (normally copper). The HTS tapes may be stacked (i.e. arranged such that the HTS layers are parallel), or they may have some other arrangement of tapes, which may vary along the length of the cable. Notable special cases of HTS cables are single HTS tapes, and HTS pairs. HTS pairs comprise a pair of HTS tapes, arranged such that the HIS layers are parallel. Where substrated tape is used, HTS pairs may be type-0 (with the HTS layers facing each other), type-1 (with the HTS layer of one tape facing the substrate of the other), or type-2 (with the substrates facing each other). Cables comprising more than 2 tapes may arrange some or all of the tapes in HTS pairs. Stacked HTS tapes may comprise various arrangements of HTS pairs, most commonly either a stack of type-1 pairs or a stack of type-0 pairs and (or, equivalently, type-2 pairs). HTS cables may comprise a mix of substrated and exfoliated tape.

When describing coils in this document, the following terms will be used:

"HTS cable"—a cable comprising one or more HTS tapes. In this definition, a single HTS tape is an HTS cable.

"turn"—a section of HTS cable within a coil which encloses the inside of the coil (i.e. which can be modelled as a complete loop)

"arc"—a continuous length of the coil which is less than the whole field coil

"inner/outer radius"—the distance from the centre of the coil to the inside/outside of the HTS cables "inner/outer perimeter"—the distance measured around the inside/outside of the coil "thickness"—the radial depth of all of the turns of the coil, i.e. the difference between the inner and outer radius "critical current"—the current at which the HIS would become normal, at a given temperature and external magnetic field (where HIS is considered to have "become normal" at a characteristic point of the superconducting transition, where the tape generates $E_0$ volts per metre. The choice of $E_0$ is arbitrary, but is usually taken to be 10 or 100 microvolts per metre.)

"critical temperature"—the temperature at which the HTS would become normal, at a given the magnetic field and current "peak critical temperature"—the temperature at which the HTS would become normal given no external magnetic field, and negligible current.

Broadly speaking, there are two types of construction for magnetic coils—by winding, or by assembling several sections. Wound coils, as shown in FIG. 2, are manufactured by wrapping an HTS cable 201 around a former 202 in a continuous spiral. The former is shaped to provide the required inner perimeter of the coil, and may be a structural part of the final wound coil, or may be removed after winding. Sectional coils, as shown schematically in FIG. 3, are composed of several sections 301, each of which may contain several cables or preformed busbars 311 and will form an arc of the overall coil. The sections are connected by joints 302 to form the complete coil. While the turns of the coils in FIGS. 2 and 3 are shown spaced apart for clarity, there will generally be material connecting the turns of the coil—e.g. they may be consolidated by potting with epoxy.

The coils may be "insulated"—having electrically insulating material between the turns of the coil, or "non insulated", where the turns of the coil are electrically connected radially, as well as along the cables (e.g. by connecting the copper stabiliser layers of the cables by soldering or by direct contact). Non-insulated coils are not suitable for large field coils, for reasons which will be discussed in more detail later.

FIG. 4 shows a cross section of a specific type of wound coil known as a "pancake coil", where HTS cables 401 are wrapped to form a flat coil, in a similar manner to a spool of ribbon. Pancake coils may be made with an inner perimeter which is any 2 dimensional shape. Often, pancake coils are provided as a "double pancake coil", as shown in the cross section of FIG. 5, which comprises two pancake coils 501, 502 wound in opposite sense, with insulation 503 between the pancake coils, and with the inner terminals connected together 504. This means that voltage only needs to be supplied to the outer terminals 521, 522, which are generally more accessible, to drive current through the turns of the coil and generate a magnetic field.

SUMMARY

According to a first aspect of the invention, there is provided a high temperature superconducting, HTS, field coil. The HIS field coil comprises a plurality of turns and a partially insulating layer. The plurality of turns comprises HIS material and metallic stabilizer. The partially insulating layer separates the turns, such that current can be shared between turns via the partially insulating layer. The partially insulating layer comprises an electrically conducting layer, and first and second insulating layers. The electrically conducting layer is coated on one side with the first insulating layer and on the other side with the second insulating layer. Each insulating layer has one or more windows through which electrical contact can be made between the turns and the electrically conducting layer. The windows in the first insulating layer are offset in the plane of the electrically conducting strip from the windows in the second insulating layer.

According to a second aspect of the invention, there is provided a method of manufacturing an HTS field coil. An HTS cable is provided, the HTS cable comprising HTS material and metallic stabiliser. A partially insulating layer is provided. The partially insulating layer comprises an electrically conducting layer and first and second insulating layers. The electrically conducting layer is coated on one side with the first insulating layer and on the other side with the second insulating layer. Each insulating layer having one or more windows through which electrical contact can be made between the turns and the electrically conducting layer. The windows in the first insulating layer are offset in the plane of the electrically conducting layer from the windows in the second insulating layer. The HTS cable and the partially insulating layer are assembled to form an HTS field coil, such that current can be shared between turns of the HTS cable via the partially insulating layer.

According to a third aspect of the invention, there is provided a high temperature superconducting, HTS, field coil having a radius greater than 50 cm, the HTS field coil having a plurality of turns comprising HTS material, wherein the turns are arranged such that current can be shared between turns via a resistive material.

According to a fourth aspect of the invention, there is provided a high temperature superconducting, HIS, field coil having a radius greater than 50 cm, the HIS field coil having turns comprising HIS material, wherein the turns are separated by a metal-insulator transition material which has a first resistivity at a first temperature which is less than a peak critical temperature of the HIS, and a second, lower resistivity at a second temperature higher than the first temperature.

According to a fifth aspect of the invention, there is provided a tokamak fusion reactor comprising an HIS field coil according to any one of the first, third, or fourth aspects, wherein the HIS field coil is one of a toroidal field coil or a poloidal field coil.

According to a sixth aspect of the invention, there is provided a proton beam therapy, PBT, device comprising an HIS field coil according to any one of the first, third, or fourth aspects, wherein the HIS field coil is one of:
- a field coil of an accelerator of the PBT device;
- a dipole or quadrupole magnet of a proton beam steering system of the PBT device.

Further embodiments of the invention are set out in claim 2 et seq.

DETAILED DESCRIPTION

Figure 1:
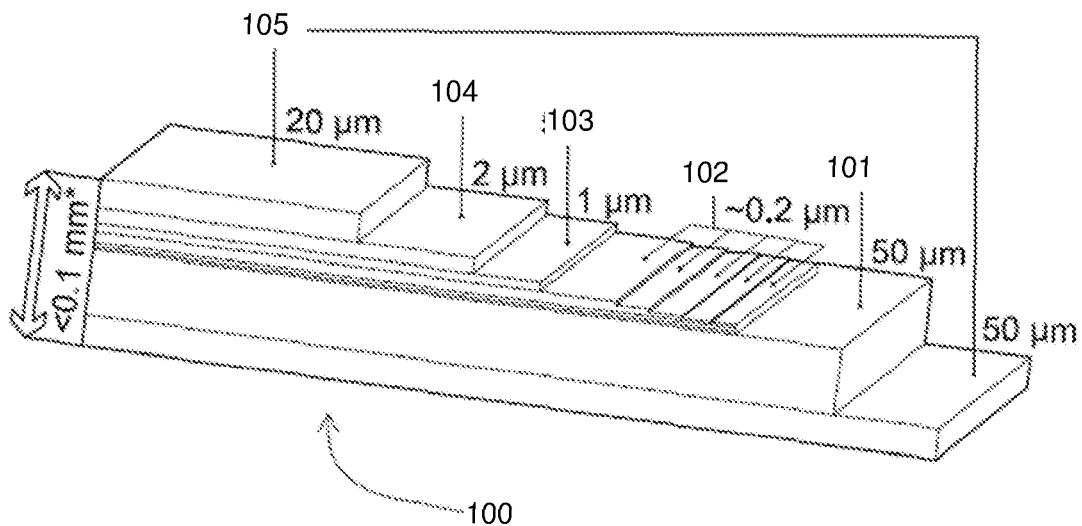
FIG. 1 is a schematic illustration of an HTS tape.
Figure 2:
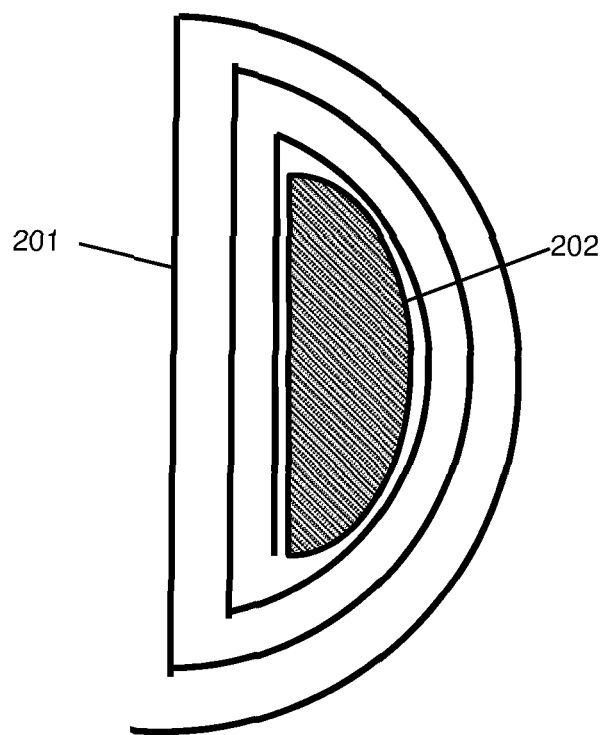
FIG. 2 is a schematic illustration of a wound HIS coil.
Figure 3:
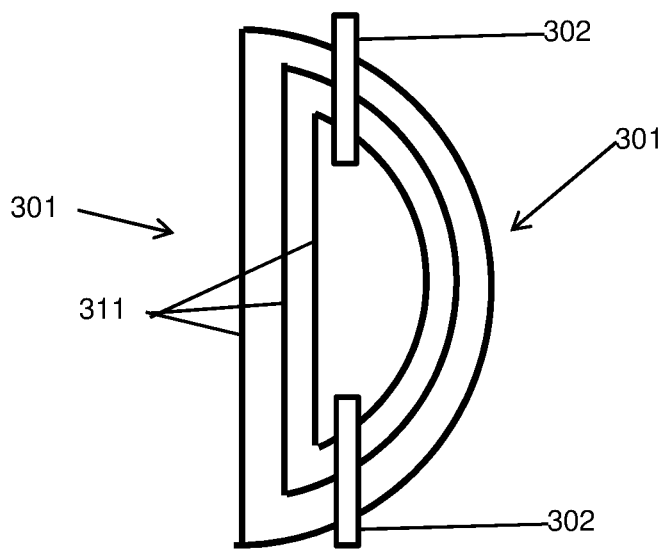
FIG. 3 is a schematic illustration of a sectional HIS coil.
Figure 4:
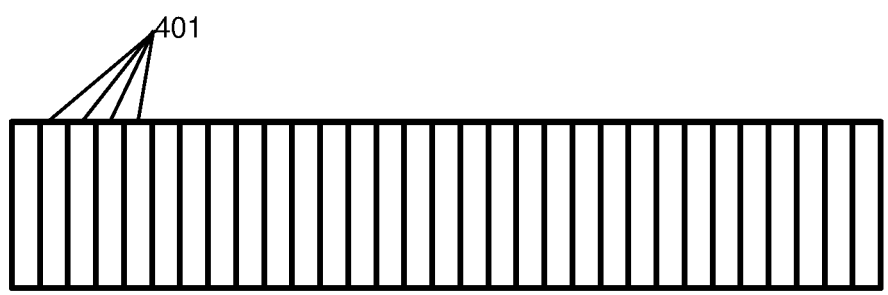
FIG. 4 is a schematic illustration of a cross section of a pancake coil.
Figure 5:
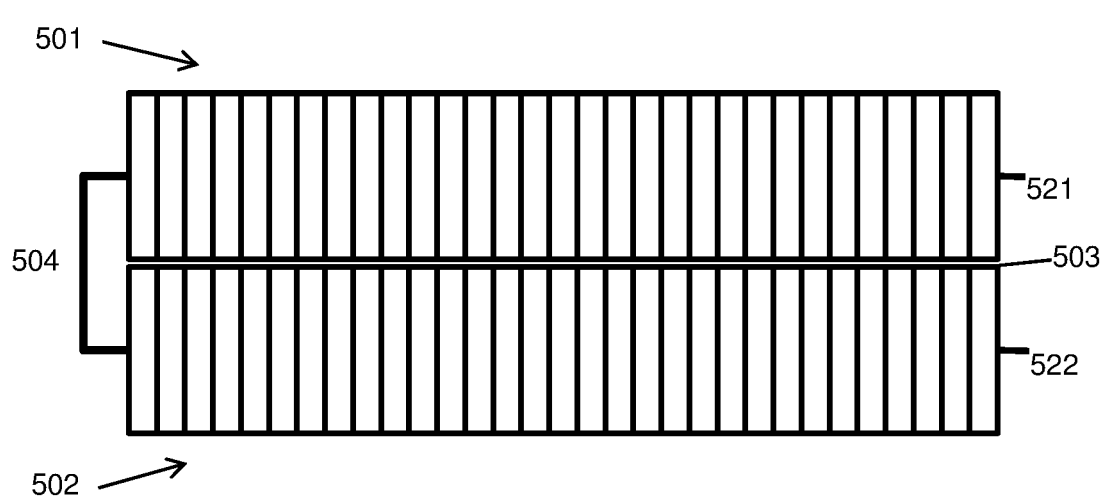
FIG. 5 is a schematic illustration of a cross section of a double pancake coil

As noted above, HIS coils may be insulated or non-insulated. In general, non-insulated coils are not considered suitable for large magnets which are operated in conditions where quenches are possible, such as the field coils of a tokamak. The lack of insulation intentionally allows current to share not only among tapes in each cable turn, but also between cable turns. "Partially insulated" coils are also possible, where the material between turns has resistance intermediate between that of a traditional conductor, e.g. a metal, and a that of a traditional insulator, such as ceramic or organic insulator, e.g. having a resistivity between 100 and $10^{15}$ times that of copper or between $10^{-6}$ and $10^8$ Ohm metre. Having no or partial insulation between turns slows the rate at which the temperature of a local "hotspot" (normal zone) rises. The rate of growth (spatial propagation) of a normal (resistive HIS) zone in an HIS magnet depends on many parameters, but is typically less than 100 mm/s in the axial direction (ie: along the cable), and roughly 2-100 times slower in the transverse direction (ie: between adjacent turns). The exact rate of propagation of the normal zone in each direction depends on the thermal and electrical properties of the materials and cable construction utilised. In particular, the rate of transverse propagation is affected by the thermal properties of the material between turns.

In a large magnet (linear dimensions of metres, e.g. radius greater than 50 cm, and where the coil cross section dimensions are small (ie ~10 times less) than the largest overall coil dimension) the transverse propagation can cause the entire cross section of the coil to become normal in a zone covering a small fraction of the coil's periphery, resulting in the total current of all turns flowing only in the metal stabilizer within the normal section. Outside the normal zone the conductors are still superconducting. The resistance of this normal zone is not enough to cause the magnet's current to fall quickly but results in the stored magnetic energy of the whole magnet being dumped into this small normal (resistive) volume, which is only growing around the coil periphery slowly. Unless this situation is detected quickly so that the magnet's stored energy can be dumped into a resistance external to the coil, the temperature of the normal zone will rise very quickly, which is likely to cause significant damage to conductors within the normal zone.

For small coils (linear dimensions of several centimetres, e.g. radius less than 10 cm, where the coil cross section is of a similar size to the largest coil dimension), the stored magnetic energies involved are relatively much lower and the normal zone will spread more evenly over the whole coil volume in a short time. In other words, the quench propagates to encompass the whole coil before the temperature of the normal zone exceeds a damaging value (typically taken to be about 200 K).

For this reason, non- or partially-insulated coils have been considered to be good options for passive quench protection of small HIS magnets, but inadequate for passive quench protection of large magnets.

Furthermore, a non- or partially-insulated coil exhibits a delay in stabilization of the magnetic field during ramp-up. This is because the voltage developed over the coil's inductance drives current through the metal between the turns. A non-insulated HIS coil can be modelled as having three current paths—two spiral paths, which follow the HTS tapes (one in the HIS and one in the metal stabilizer), and a radial path through the metal (and any other resistive material) connecting the non- or partially-insulated HTS cable turns between the coil terminals (while this can be modelled as a single path, it in fact represents the sum of all radial resistive paths through the magnet). Only current flowing in the spiral paths generates significant axial magnetic field in the centre of the coil. The HIS spiral path can be modelled as an inductor having inductance L and zero or negligible resistance when the tape is all superconducting. The copper stabilizer spiral path is in parallel with the HIS path and has the same inductance, but significant resistance. For this reason negligible current flows in it unless parts of the HIS spiral path start to quench. If this happens the excess current above the critical current Ic of the HIS spiral path shares between the spiral stabilizer path and the radial path according to their relative resistances. The radial current path can be modelled as having a negligible inductance and a much greater resistance R than the spiral path while the HIS is superconducting throughout.

Figure 6:
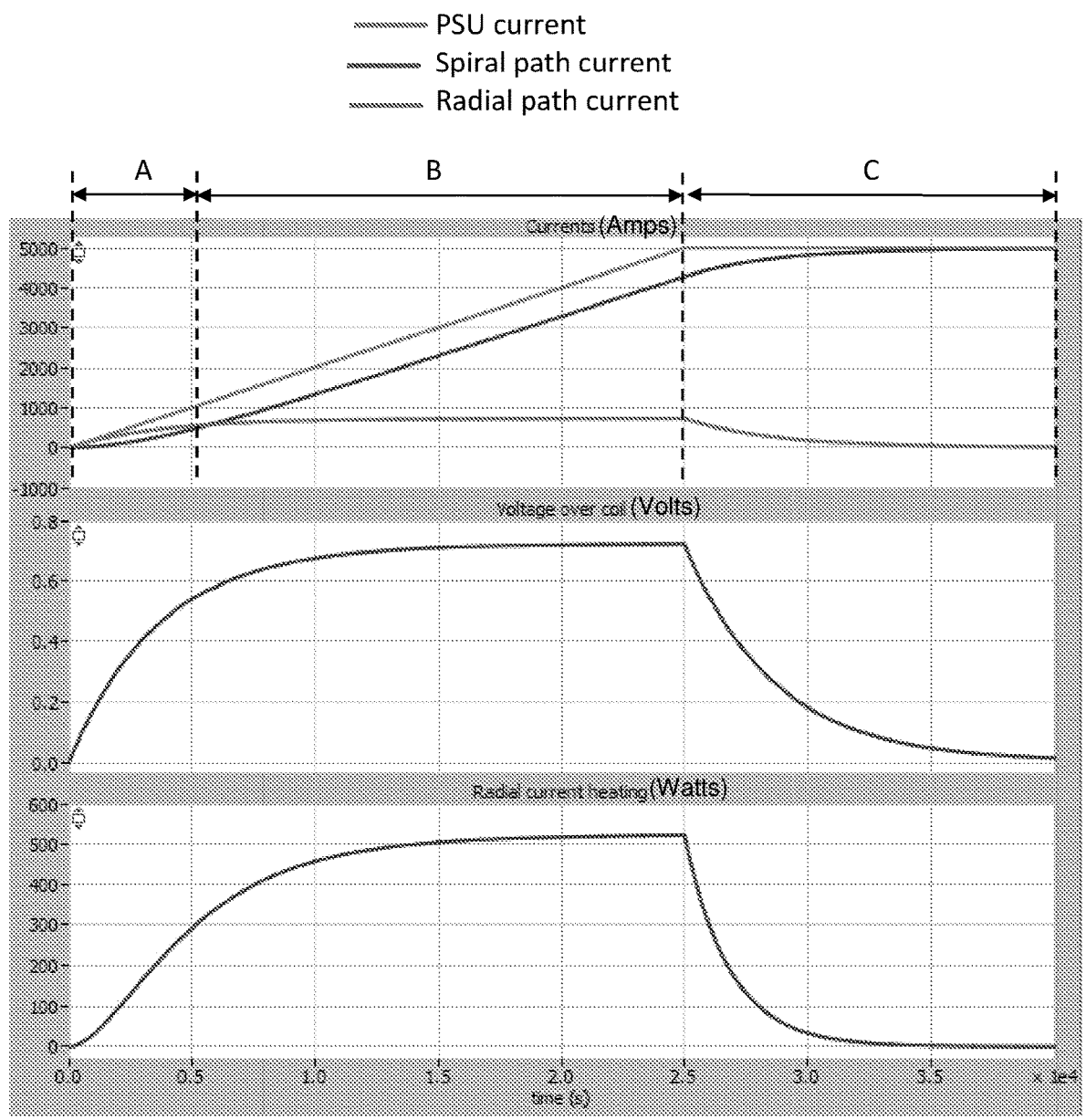
FIG. 6 shows the current, voltage, and power in a partially insulated coil during ramp up and into steady state.
Figure 7:
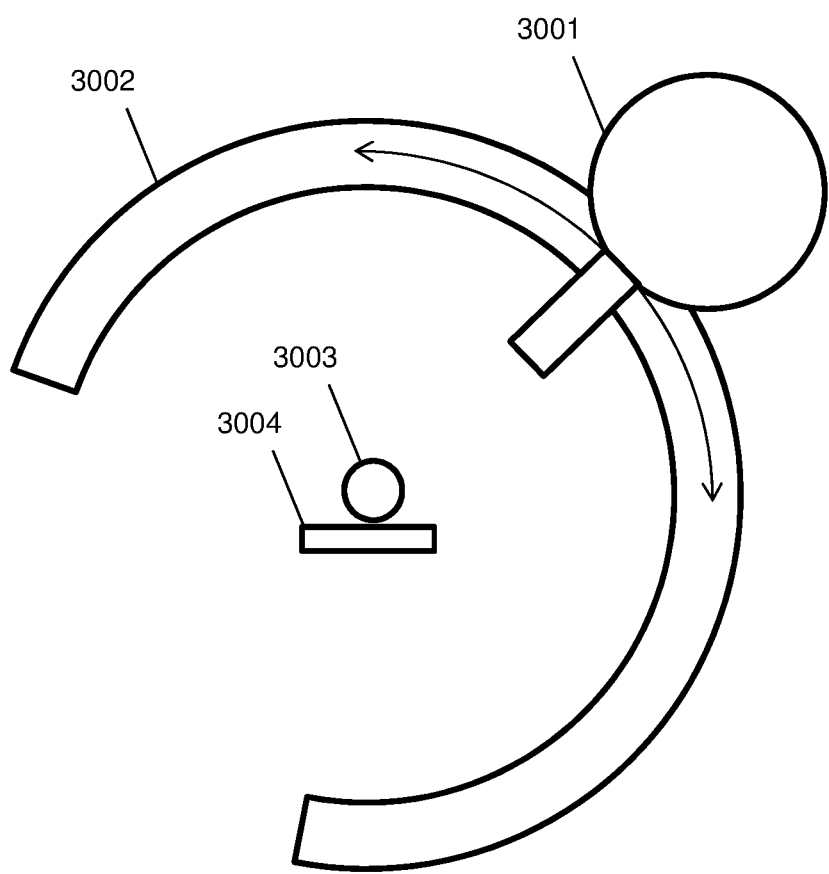
FIG. 7 is a schematic illustration of a proton beam therapy device.
Figure 8:
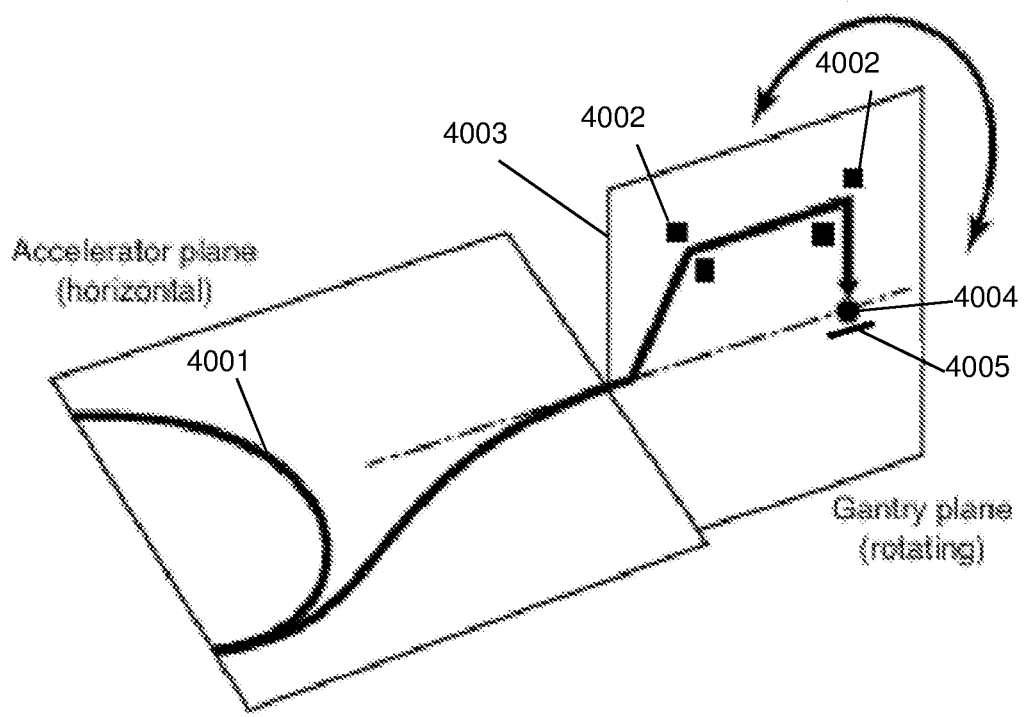
FIG. 8 is a schematic illustration of a further proton beam therapy device

FIG. 6 shows the current, voltage, and power in a non-insulated coil during ramp-up and into steady state operation. During ramp-up of a non-insulated coil, current will initially flow primarily in the radial path (period A in FIG. 6), and then stabilize. The amount of current flowing in the radial path is higher for faster ramp rates (since the voltage developed across the spiral path, L·dI/dt, is higher—this is period B). At the end of the ramp, dI/dt drops to zero and current will transfer to the HIS spiral path with a time constant L/R (period C). The current will be mostly transferred into the spiral path a few (approximately five) L/R time constants after the end of the ramp. As such, the time constant should be selected to result in a reasonable ramp-up time, e.g. a time constant of 5-10 hours would be acceptable for the TF coil of a tokamak (giving a ramp-up time of about 1-2 days).

If there are joints in the HTS cable used to wind the coil, then a small fraction of the power supply current will continue to flow in the radial path during period C. The fraction is simply the ratio of the spiral path resistance to the sum of the radial resistance (ie: sum of all turn-to-turn, or inter-turn, resistances) and the spiral path resistance.

Keeping the charging delay time constant short in a magnet with large L demands a relatively high inter-turn resistance, but keeping the normal zone temperature low demands a relatively low inter-turn resistance. It is therefore desirable to find a way to easily control the turn-to-turn resistance to achieve the best compromise.

A further consideration in selection of the ideal turn-to-turn resistance is the heatload caused by driving current through the radial resistance during the magnet ramping phase (periods A & B). This additional heatload, which can be substantial (order of several kW) would require no additional cooling if it is less than or equal to the heatload that occurs during operation of the device comprising the field coil—e.g. the neutron heat load for coils in a fusion reactor. This is possible because the operational heatload and ramping heatload cannot occur simultaneously (e.g. because fusion is not initiated until the TF magnet is at field). Of course, it is also possible to ramp up with a higher heatload (i.e. higher turn-to-turn resistance), and provide additional cooling—this will generally be more costly, but allow for faster ramp times.

In a large magnet, in order to avoid damage from a quench (in either an insulated or non-insulated coil), an active quench protection scheme may also be implemented. In this scheme the magnet's stored energy may be dumped into some component other than the quenching region of the magnet before sufficient temperature rise can occur in the quenching region to cause damage. The other component may be an external resistance, or a separate portion of the magnet which is quenched over a larger proportion of the magnet's cold mass (thereby distributing the magnet's stored energy over a large volume, and reducing the overall temperature rise). However, the active approach requires the time between initiation of the normal zone (also called a "hot spot") and triggering of the magnet current ramp-down ("dump") to be short enough that the terminal temperature of the hot spot is less than a temperature at which damage to the coil can occur, eg: around 200 K.

It is therefore desirable to develop means to control the time constant of the coil such that it can be ramped to a stable magnetic field in an acceptable time frame, whilst still providing a degree of current sharing between the turns around a quenched normal zone to limit the rate of increase in hotspot temperature.

The possible parameters of the coil which can be varied to select the time constant L/R are:

the inductance L, which is proportional to the square of the number of turns, N, in the coil. Hence the time constant can be reduced by reducing the number of turns. However, the magnetic field is proportional to amp-turns, so generating a high field with a small number of turns will require a higher transport current than a magnet generating the same field with more turns and lower transport current.

the turn-to-turn radial resistance, $R_T$ (where $R=NR_T$)

In terms of these parameters, R is approximately proportional to $NR_T$, and L is approximately proportional to $N^2$, so L/R is approximately proportional to $N/R_T$. The minimum value of N will be set by the magnetic field required (B), and the maximum current per cable (I), as B is proportional to NI. The time constant, and heat load during ramping, can be reduced by using fewer turns but this will require a higher current for the magnet to produce a given field.

The time constant and ramping heat load can also be reduced by increasing the resistance $R_T$ between each turn. However, increasing $R_T$ too high will inhibit current sharing between the turns—reducing the "passive quench protection" of the coil, i.e. the ability of the coil to recover from a hotspot without quenching and without dumping energy from the coil. High current cables require multiple tapes to carry the current and it is desirable to keep the resistance between the tapes in a turn very low, specifically to allow good current sharing and high thermal conductivity between the tapes; this makes the tape robust to defects in the ReBCO superconducting layer. Where each turn comprises a plurality of tapes the required $R_T$ may be much greater than the resistance between the tapes of each turn, so that current is preferentially shared within a turn to bypass defects rather than between turns—however $R_T$ should still permit current sharing between turns to limit the rate of thermal runaway of a hotspot and maximise the time to detect the problem and dump the magnet.

It has been found that the use of a partially-insulated coil can significantly extend the time window between initiation of the hotspot and the normal zone temperature exceeding 200 K, when compared to an equivalent insulated coil, allowing additional time for initiation of the magnet dump. This makes partially-insulated coils with the correct choice of $R_T$ surprisingly suitable for use as large field coils in a tokamak.

Within this time window, the hotspot must be detected, the quench detection system must determine that the hotspot is likely to cause a quench (rather than dissipate through passive current sharing), and dump the energy from the magnet in safe way—i.e. forcing a large cold mass to warm up in a controlled manner (the large cold mass may be a deliberately quenched part of the magnet, e.g. the return limbs of a toroidal field coil).

The duration of the time window depends on the amount of conductive metal, e.g. copper, in each turn—with more metal stabiliser, the time window is extended. However, increasing the amount of stabiliser will reduce the current density of the coils, which is undesirable in space-limited applications such as the central column of a toroidal field coil (where higher current density allows a thicker neutron shield in a fusion reactor, and hence less heat load, or a more favourable aspect ratio or smaller overall size for a spherical tokamak).

Current quench protection approaches using insulated coils for spherical tokamaks result in more metal stabilizer in the turns, which in turn results in larger, costlier devices in order to increase the time window to manageable levels—but the time window is still short (on the order of 0.5 to 1 second). The use of a non-insulated or partially insulated toroidal field coil would allow for the time window to be extended and for the current density to be increased—as non- or partially-insulated coils require less metal stabiliser than insulated coils. In fact, the limit on current density for a non-insulated toroidal field coil is a mechanical, rather than electrical problem, as the stress on the central column becomes the limiting factor as the current density is increased. Eventually the resultant strain in the tape materials is transferred to the ReBCO layer, causing degradation in critical current.

Consider an example toroidal field (TF) magnet having plasma radius 1.4 m and magnetic field of 5 T with 18 limbs. The total TF centre rod current would be 35 MA. Assuming a transport current of 10 kA each limb would have 196 turns and the total TF inductance would be approximately 46 H. To achieve a time constant of 1.4 hours (in order to have a total ramp time of about 6 hours) would require a radial resistance for each individual limb of about 0.5 milliOhms. Therefore, the average turn-to-turn resistance $R_T$ should be 2.54 micro-Ohms to achieve the desired time constant.

Through modelling, it has been found that this can be achieved using a partially insulating layer between turns with a thickness of 0.05 mm and a resistivity of 0.02 ohm·m, which is $2 \times 10^6$ times more than normal copper at 20 K. The skilled person will appreciate that other parameters for the partial insulation would also be possible.

$R_T$ may be adjusted by the selection of metals for the cladding within the HTS cable and/or between turns of the coil. In typical HTS cables, this would be copper, but to allow for greater resistance other metals such as stainless steel may be used. Alternatively or additionally, the spacing between turns of the coil may be increased, resulting in a thicker (and hence more resistive) layer of metal between turns of the coil. Suitable materials that would also satisfy other engineering constraints (e.g. current density and structural stability) include germanium and other semi-conductors.

Figure 9A:
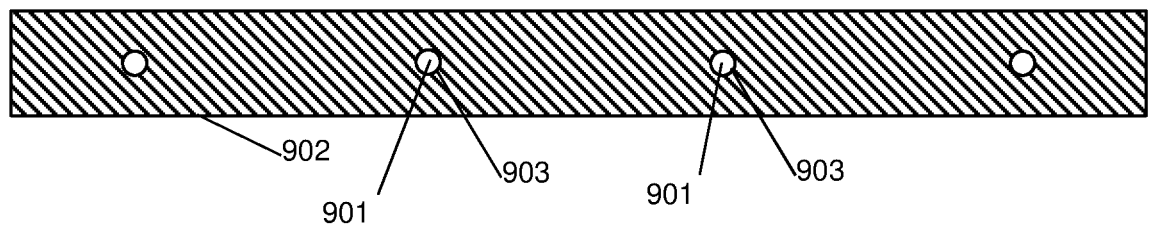
FIG. 9A is a schematic illustration of a partially insulating layer.
Figure 9B:
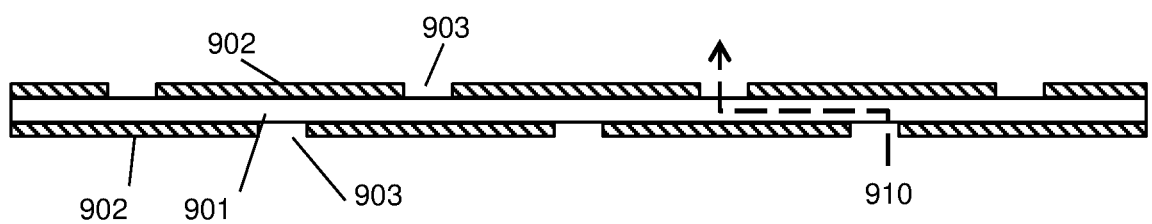
FIG. 9B is a side view of the partially insulating layer of FIG. 9A.

A further alternative is to use normal (i.e. non-superconducting) metals for the insulation, but adjust the current path geometry using conventional insulation. In other words increase the distance over which current is forced to flow between turns. The material between turns of the coil may include a partially insulating layer comprising a metal strip (or other electrically conducting strip) having "leaky insulation", as shown in FIGS. 9A and B. The metal strip 901 is provided with a thin insulating coating 902 on at least the sides facing the HTS cables, where the insulating coating is removed or missing over windows (or "through holes") 903 at intervals on each side of the metal strip. The windows can have any shape and can extend to the edges of the tape. The location of windows on either side of the metal strip are staggered, as shown in FIG. 9B, which increases the resistance (compared to an uninsulated strip, or to a strip where the windows on each side were directly opposite each other) as the current must take a path 910 along part of the length of the metal strip.

The resistance of the partially insulating layer shown in FIGS. 9A and B (i.e. the turn-turn resistance) will depend on:

- the distance between adjacent windows on the same side (greater distance leads to more resistance). This is the dominant effect.
- the offset between adjacent windows on opposite sides, i.e. the distance between a window on one side and the adjacent window on the opposite side (greater offset leads to more resistance)
  The resistance will also vary with the relative offset on either side of a window, and is maximised for a given distance between windows on the same side when the windows on one side are half way between the closest windows on the opposing side. This arrangement also provides even resistive heating of the partially insulating layer.
- the thickness of the metal strip (where the offset is significantly greater than the thickness, greater thickness leads to less resistance)
- the width of the metal strip (greater width leads to less resistance)
- the resistivity of the metal strip (greater resistivity leads to more resistance)
- the area of the windows (greater area leads to less resistance). However, the window area is only significant if the distance between windows is comparable to window dimensions.

The exact relationship can be modelled by commonly available techniques as known in the art or by simple experimentation.

It is not essential for the spacing of the windows to be regular. The important factor is that for current to pass from the turn on one side of the strip to the other, it must pass through a window into the strip, then along the strip, and exit via another window on the opposite side of the strip. It is clearly possible for current entering one window to split into multiple paths and exit via several windows. The proportion of current following each path will simply depend on the impedance of that path (the impedance will be dominated by the resistance of the paths for slowing varying currents, but the path inductances will come into play for rapidly varying currents).

Unless the distance between windows on opposite sides of the strip is comparable to the dimensions of the window, the resistance of the path between windows will be dominated by, and proportional to, the distance between windows and inversely proportional to the thickness of the strip. This is the desired arrangement for the partially insulating strip.

If varying resistance at different points in the coil is desired, then any of these properties may be changed along the length of the partially insulating layer.

The insulating coating may be, for example, polyamide applied in the form of Kapton™ tape or as a liquid, mylar film, insulating varnish, or any other suitable insulator.

The metal may be copper, brass, stainless steel, hastelloy, or any other suitable metal (or non-metallic conductor) as required. The use of materials such as stainless steel of hastelloy allows the partially insulating layer to also provide improved structural stability, compared to a conventional all-copper magnet, which aids in dealing with the large stresses experienced in a high-field tokamak.

The HTS coil may be wound as normal, with the partially insulating layer placed between the turns as they are wound. The HTS coil may be encapsulated in resin or soldered together—in the latter case, the partially insulating layer may optionally be coated with a solderable coating to improve the solder adhesion between turns. The partially insulating layer is continuously wound with the HIS turns, such that it separates each turn of the coil.

The windows may be manufactured by etching, by cutting of an insulation strip prior to application to the metal strip, by masked spray coating, by ink-jet printing, or by other suitable methods as known in the art (e.g. using techniques known for flexible PCB manufacture).

Where the distance between windows is significantly greater than the size of the windows, and the windows are offset such that windows on one side are half way between windows on the other side, the turn-turn resistance $R_{TT}$ can be approximated as:

$$R_{TT} = \frac{d^2\rho}{4wtL}$$

where d is the distance between windows (i.e. between a window and the next window on the same side), p is the resistivity (taking into account that the coils will be operating at low temperature and high magnetic field), w is the width of the tape, t is the thickness of the metal strip, and L is the average length of each turn.

For example, a turn-turn resistance of 2.54 micro-ohms could be achieved with a brass strip ($\rho$=45 n$\Omega$·m at ~20 K) having a width of 20 mm, a thickness of 50 microns, a turn length of 16.2 m, and a distance between windows d of 60.5 mm.

Figure 10A:
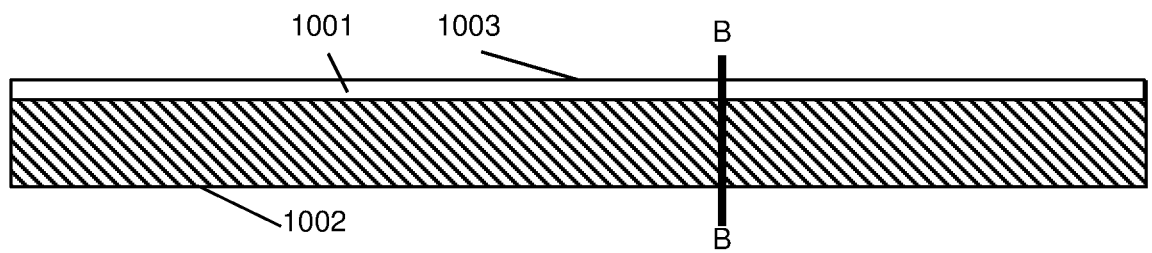
FIG. 10A is a schematic illustration of a partially insulating layer according to an alternative construction.
Figure 10B:
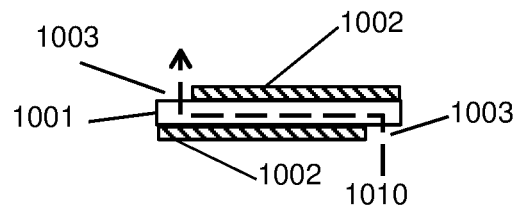
FIG. 10B is a cross section of the partially insulating layer of FIG. 10A.

An alternative "leaky insulation" structure is shown in FIGS. 10A (plan view) and 10B (cross section B-B in 10A). As previously described, the metal strip 1001 is provided with a thin insulating coating 1002 on at least the HTS-facing sides. In this case, instead of longitudinally spaced windows being provided as with the previous example, each insulating coating 1002 has a single window 1003 (or "lane") which extends the length of the metal strip, and the window on each side of the metal strip is on an opposite edge (e.g. the strip may have a window on the left of the top surface, and on the right of the bottom surface, as viewed from one end of the strip).

The windows are showing as extending to the edge of the metal strip, but this need not be the case—i.e. there may be insulating material on both sides of the window.

The windows are arranged such that they do not overlap, allowing current 1010 to flow through the strip by only travelling along the width of the strip.

In this structure, the turn-to-turn resistance is determined by:
- the distance between the window on one side and the window on the other side (as measured by their inside edges, along the width of the strip, greater distance leads to more resistance).
- the thickness of the metal strip (greater thickness leads to less resistance)
- the resistivity of the metal strip (greater resistivity leads to more resistance)
- the width of each window (greater width leads to less resistance). As with the area of the windows in the previous construction, this is a minor effect—though note that in this case the distance between windows and the width of each window will be bounded by the width of the metal strip.

Where the distance between windows is significantly greater than the thickness of the strip, the turn to turn resistance is given as:

$$R_{TT} = \frac{s\rho}{tL}$$

where s is the distance between windows, $\rho$ is the resistivity (taking into account that the coils will be operating at low temperature and high magnetic field), t is the thickness of the metal strip, and L is the length of each turn.

For example, a turn-turn resistance of 2.54 micro-ohms could be achieved with a stainless steel strip ($\rho$=486 n$\Omega$·m) having a width of 20 mm, a thickness of 50 microns, and an uninsulated strip of 7.9 mm at opposite edges on each side.

In the general case of which both constructions above are particular examples, the partially insulating layer comprises a metal strip having a thin insulating layer on each side. Each insulating layer has one or more windows, which are offset in the plane of the metal strip from the windows of the other layer (in addition to the offset due to the thickness of the strip). The offset distance may be greater than the thickness of the metal strip, and significantly less than the length of a turn of the coil (e.g. at least five times less, at least ten times less, or at least 100 times less). The windows allow electrical contact between the HTS tape and the metal strip, which results in a current path between adjacent HTS tapes in the wound coil which travels transversely across the metal strip (either along the length or along the width). This enables the resistance of the partially insulating layer to be easily controllable by varying the positioning and spacing of the windows, and results in a greater resistance than would be obtained by a metal strip of similar dimensions alone.

The windows may be evenly distributed along the length of the partially insulating layer, with such distribution extending along the full length of the partially insulating layer. Alternatively, the distance between windows (or other properties of the windows) may be varied along the partially insulating layer so that the total resistance of each turn of the coil is constant.

In the case where only one window is provided on each partially insulating layer, each window may extend the full length of the partially insulating layer.

In order to ensure electrical contact through the windows, the partially insulating layer may be soldered onto the HTS cables during winding. Alternatively, contact may be achieved merely due to the pressure in the coil once wound. As a further alternative, additional electrically conductive inserts may be added into the windows, or the metal strip may have protrusions which extend into the windows. The inserts or protrusions may fill the entire window, or may fill only a portion of the window. For example where the window is a "lane", the inserts may be provided at intervals along that lane. This results in the inserts effectively acting to reduce the size of the window, and can be used to further tune the resistance of the partially insulating layer.

All of the various arrangements of windows disclosed above may be achieved via a combination of windows and metal inserts or protrusions which partially fill the windows—e.g. the spacing of the metal inserts may be varied along the partially insulating layer to ensure that the resistance per turn of the coil is constant.

Physical connection of the partially insulating layer and the HTS coil can be via pressure alone (i.e. simply by the compact winding of the coil), by adhesive (e.g. epoxy) connection of the insulating coating and the outer surface of the HTS cable, and/or by soldered connections between the outer metal surface of the partially insulating layer and the HTS cable.

Figure 11:
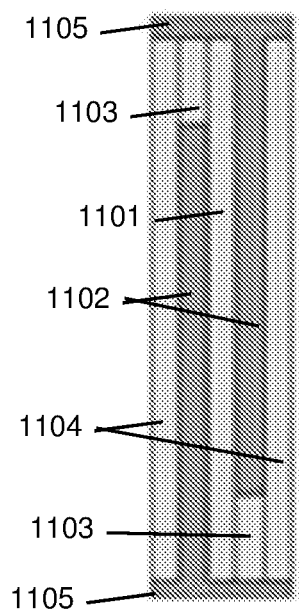
FIG. 11 is a schematic illustration of an exemplary partially insulating layer.

FIG. 11 shows some further improvements which may be made to the partially insulating layer to ensure good physical and electrical connection. As previously, the partially insulating layer comprises a metal (or other electrically conductive) strip 1101 and thin insulating coating 1102. Metal inserts 1103 may be placed in the windows or the metal strip may have protrusions which extend through the windows to facilitate contact with the HTS cables.

Alternatively or additionally, to provide a larger soldering surface (and therefore easier manufacturing of the coil and a more strongly bonded coil), the partially insulating layer may also comprise further metal strips 1104, hereafter "connection strips" bonded to the outside faces of the insulating layer. These connection strips have negligible effect on the electrical properties of the layer, but allow the partially insulating layer to be soldered to the HTS cable along substantially the whole surface.

The partially insulating layer may also have insulating material 1105 bonded to the edges of the partially insulating layer, covering at least the edges of the metal strip 1101, to avoid solder bridges across the partially insulating layer and/or across the insulating coating when the coil is manufactured.

The partially insulating layer may be manufactured as a flexible PCB—with the insulating coatings being bonded to the metal strip by adhesive, and then etched to form the windows, with any further metal elements being bonded to the insulating coating or the metal strip as appropriate, such that they are in electrical contact with the metal strip. Alternatively the insulating coating may have the windows pre-cut (or be sized so as to provide "lanes" when applied to the strip), and then be bonded to the metal strip during winding by adhesive. Other manufacturing methods may also be used.

Figure 12:
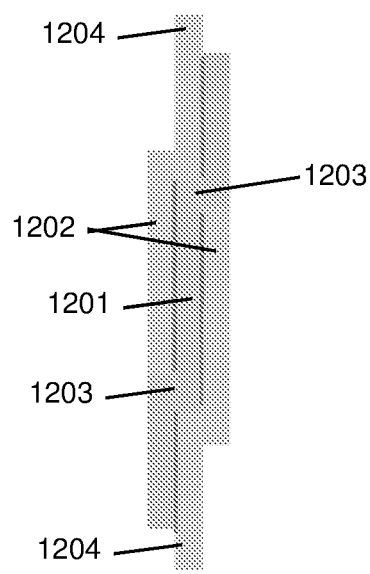
FIG. 12 shows an alternative construction of the partially insulating layer.

FIG. 12 shows an alternative construction of the partially insulating layer. As before, the partially insulating layer comprises a metal strip 1201 and insulating coating 1202, arranged to form a "lane" at one edge of each side of the metal strip (as described above with reference to FIGS. 10A and B). In this case, the metal strip is provided with a "joggle" or "kink" 1203—i.e. it is bent such that the portion of the metal strip exposed by the window lies in the plane of the insulating coating. The insulating coating may be provided with an overhang 1204, to prevent unwanted bridging between the metal strip and the HTS tape on the other side of the insulating coating when soldering.

While the above has primarily been written from the point of view of a partially insulating layer formed by applying insulation to the metal strip, and then winding this with the HTS cable to form the coil, it will be appreciated that constructions where the insulation is applied to the HTS cable which is then wound with a bare metal strip are equivalent, as are constructions where the HTS cable, insulation, and metal strip are brought together during winding. In effect, the "partially insulating layer" can be formed in-situ when the coil is wound.

In a further alternative of a leaky insulation layer, a helical wrap of insulating material, such as Kapton™ tape, could be wrapped around a strip of metal, intentionally leaving gaps between the insulation turns to form the "windows". Alternatively, each turn could be helically wrapped with an insulating layer, leaving gaps to form the "windows".

However, controlling the resistivity (i.e.: contact areas of the windows and offset between windows on opposite sides) between adjacent turns would be more difficult with the latter approach.

FIG. 16 A to E shows a yet further alternative leaky insulation layer. As with previous examples, technical features of this example do not necessarily need to be used together, and may be combined with features of other examples where appropriate. The leaky insulation layer comprises 5 layers, which are, in order:

a first metal connection layer 1611;
a first insulating layer 1621;
an electrically conducting layer 1630;
a second insulating layer 1622;
a second metal connection layer 1612.

FIGS. 16 A to C show the layout of the first metal connection layer 1611, electrically conducting layer 1630, and second metal connection layer 1622 respectively. FIGS. 16 D and E are cross sections along the lines D and E in FIGS. 16 A to C.

As with previous examples, the connection layer is present to facilitate attachment to HTS cables by soldering.

In contrast to the previous examples where the electrically conducting layer is a continuous metal strip, in this example the electrically conducting layer is divided into several conductive regions. These regions come in two types. The square regions 1631 (though they may be any shape in practice) are connected by vias 1606 only to one of the metal connection layers. These regions do not affect the electrical properties of the partially insulating layer, but provide a thermal path through the respective insulating layer. By varying the size of these regions and the number of connections between them and the metal connection layer, the thermal properties of the partially insulating layer can be varied independently of the electrical properties.

Figure 16A:
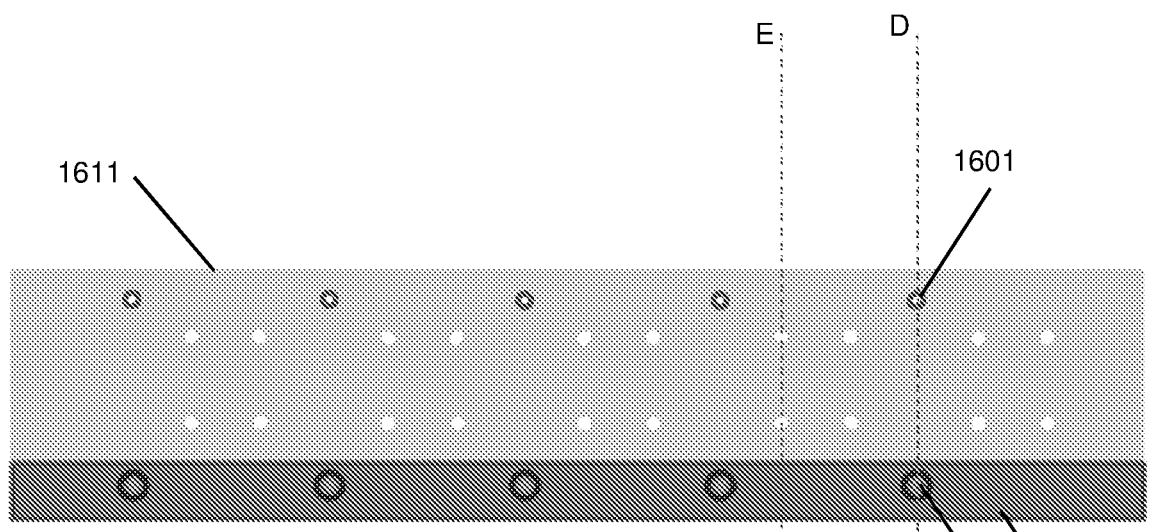
FIGS. 16 A to E show a further alternative construction of a partially insulating layer.
Figure 16B:
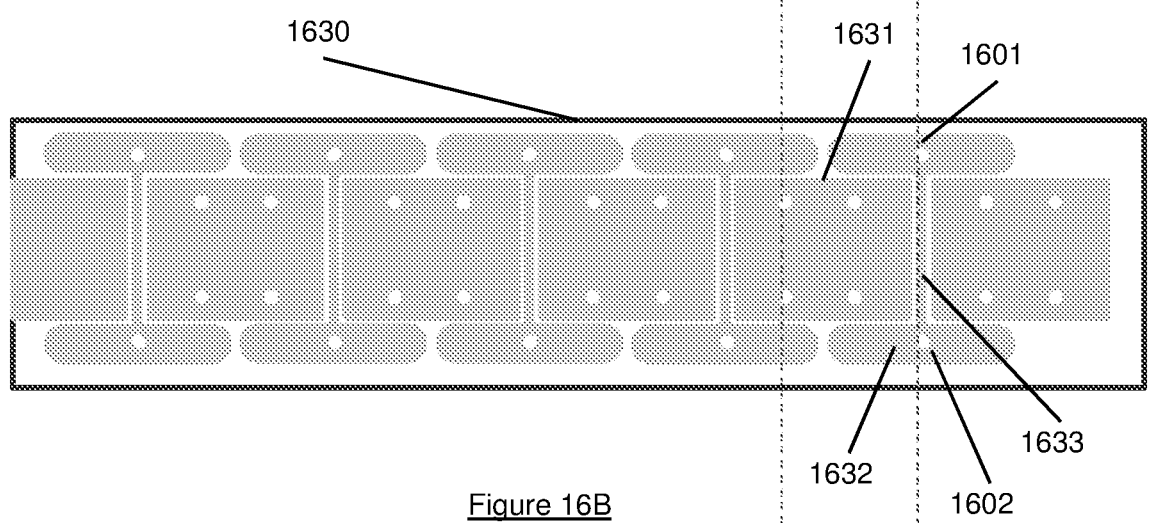
Figure 16C:
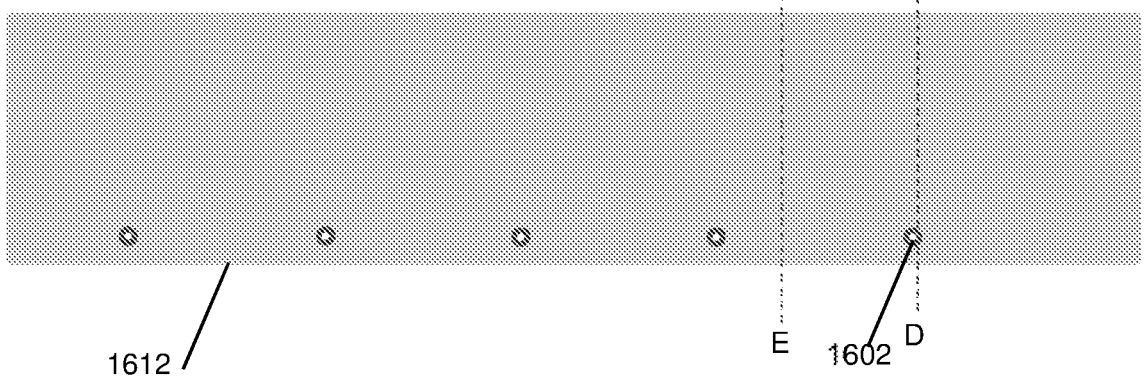
Figure 16D:
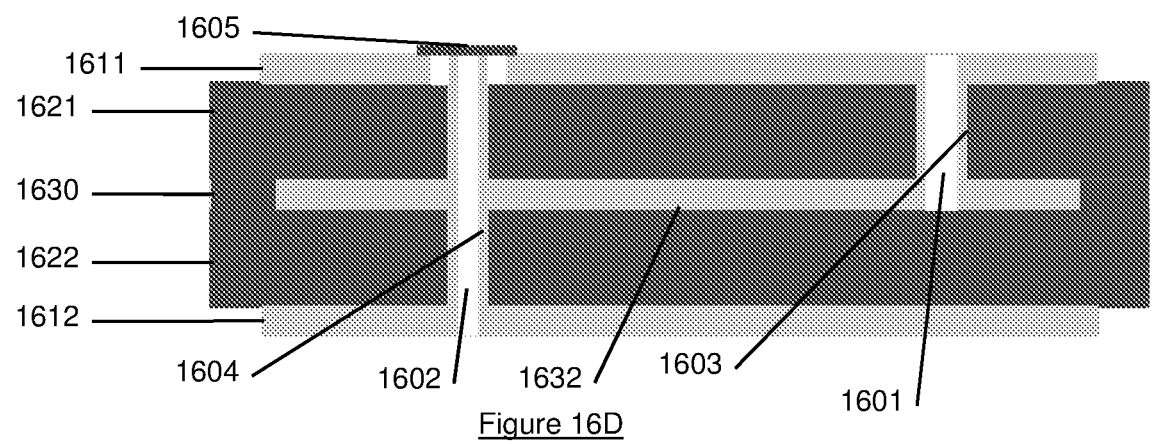
Figure 16E:
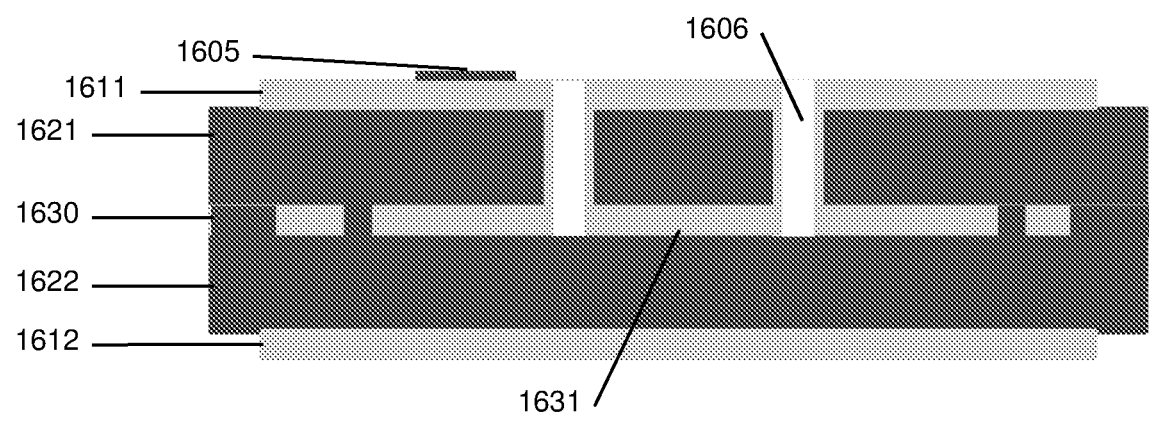

The other regions 1632 each connect a window 1601 of the first insulating layer 1621 to a window 1602 of the second insulating layer 1622. The resistance between the windows can be controlled by varying the geometry of the regions 1632—e.g. where the region 1632 contains a track 1633 which is elongate as shown in FIG. 16B, increasing the width of the track would reduce the resistance between the windows, and increasing the length of the track (e.g. by providing a non-linear track, or by moving the windows) would increase the resistance between windows.

The windows 1601 in the first insulating layer are formed by drilled vias through the first connection layer and the first insulating layer, which are then plated with metal 1603 (or other electrically conductive material) to connect the first connection layer and the electrically conductive layer. The windows 1602 in the second insulating layer are formed by drilling a via 1602 through all of the layers, which is then plated with metal 1604 (or other electrically conductive material). To prevent a connection being formed to the first connection layer through the windows 1602 of the second insulating layer, the first connection layer is etched around the via 1602 to electrically isolate it, and an insulating cap 1605 is placed on the end of the via 1602 to ensure no bridging occurs due to soldering or contact with the HTS cable.

As an alternative, the windows 1602 may instead be drilled from the other side of the partially insulating layer, such that they pass through the second connection layer, second insulating layer, and electrically conducting layer, and do not pass through (or do not pass completely through) the first insulating layer. As a further alternative, all the windows may be formed from vias which pass through all layers, with etching of the second connection layer and an insulating cap on the second connection layer being used for windows 1601 of the first insulating layer.

As an example, a partially insulating layer according to FIGS. 16 A to E may be manufactured by a flexible PCB process, as follows:

The first insulating layer 1621 is provided, and plated with copper on its upper and lower surfaces (to form the first connection layer 1611 and electrically conducting layer 1630 respectively).

The copper-plated first insulating layer 1621 (i.e. the layers 1621, 1611*m* 1630) is drilled to form the vias 1601 and the holes are plated (1603).

The electrically conducting layer 1630 is etched to form the regions 1632 (and optionally the regions 1631, though these may be etched away is desired).

The second insulating layer 1622 is applied to the electrically conducting layer 1630. This may be the same insulator as the first insulating layer, or a different insulator.

In one example, the second insulating layer may be an adhesive which is used to connect the second connection layer.

The second connection layer 1612 is applied to the second insulating layer 1622.

Vias are drilled as described above to form the windows 1602 in the first and second insulating layers.

The vias are coated with copper 1604.

The first connection layer is etched to isolate the windows 1602 from that layer (1611).

An insulating cap 1605 is applied to the end of the vias forming the windows 1602 at the first connection layer 1611.

Of course, where only some of the features of the example of FIGS. 16 A to E are used in a partially insulating layer, the method steps corresponding to absent features would not be performed.

It will be noted that in general features of the examples of partially insulating layers disclosed above can be combined in a variety of ways, and may be used separately from other features in the respective examples. For example, the windows in the insulating layers may be provided as for the "lanes" example (FIG. 10A), with a single elongated window on the edge of each insulating layer, combined with the patterned electrically conducting layer of FIG. 16B, and the electrically conducting layer may be provided with a "joggle" to bring the electrical contacts of the patterned electrically conducting layer into the plane of the insulating layer, as per FIG. 12.

It is noted that while much of the above description has been focused on large HIS coils, the "leaky insulation" disclosed above would also be applicable to smaller HIS coils in order to provide a controlled turn to turn resistance in those coils.

Various methods of manufacturing a coil including such "leaky insulation" will now be discussed. These are presented as examples only, and the skilled person will ready appreciate that other methods of winding are possible, and that elements of each example may be combined in a variety of ways not presented herein.

The partially insulating layer may be pre-formed (e.g. by a flexible PCB manufacturing process as described above), or may be formed in-situ during the winding. Applying the insulating coating to the metal strip may involve applying an adhesive (e.g. an epoxy) to the insulating coating and/or metal strip before connecting them.

Where the partially insulating layer is formed before winding into the coil (either pre-formed, or by an earlier stage of the winding process, as described later), the layer may be provided with an HTS tape on each side, to facilitate easier connection during the winding process.

Figure 13:
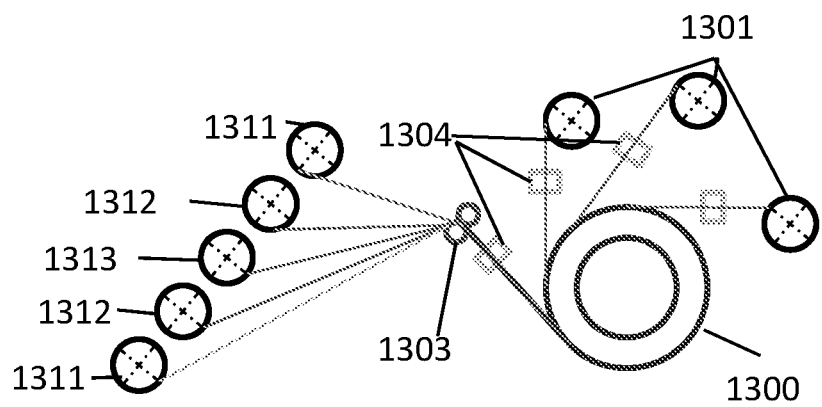
FIG. 13 shows a schematic diagram of an exemplary winding system.

FIG. 13 shows a schematic diagram of an exemplary winding system. The coil 1300 is wound from three spools of HTS tape 1301, and a partially insulating layer 1302. The partially insulating layer is formed in-situ from two spools of HTS tape 1311, two spools of insulating tape 1312 coated on each side with dry epoxy, and a spool of stainless steel foil 1313. The partially insulating layer plus HTS tape assembly is bonded together by passing it through heat and pressure rollers 1303 (which may be omitted or replaced with rollers that do not apply significant heat or pressure if the pressure of the winding is sufficient to cure the epoxy). Each of the partially insulating layer 1302 and HTS tapes 1301 is passed through a flux box 1304 to apply flux to the exposed surfaces.

While the coil in FIG. 13 is shown as circular, a similar winding system may be used to wind any shape of coil (e.g. using a differently shaped former).

Figure 14:
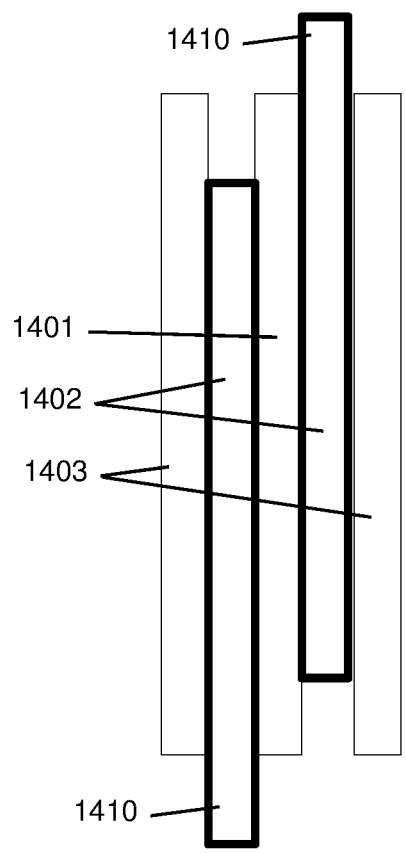
FIG. 14 is a cross section of a partially insulating layer plus HTS tape assembly.

FIG. 14 shows a cross section of the partially insulating layer plus HTS tape assembly. The assembly comprises a stainless steel tape 1401 sandwiched between insulating layers 1402, which are in turn sandwiched between HTS tapes 1403. Each layer is bonded with epoxy, though no epoxy is used on direct connections between the stainless steel tape and the HTS tape (to ensure a good electrical connection). This manner of manufacturing the coil is preferred for larger coils—as the minimum bending radius of the partially insulating layer plus HIS assembly will be more limited than that of a single HTS tape (due to the thickness of the assembly). However this may be overcome by partially "pre-bending" the assembly on manufacture, i.e. forming it in a partially bent state (such that the "zero-strain" position is at a radius of curvature intermediate between a straight tape and the minimum radius of curvature of the coil).

In the example shown, the insulating tape is arranged to provide the "lanes" embodiment, with a single large window on one edge of each side of the tape. This is achieved by offsetting the insulating tape from the HTS tape and stainless steel tape during winding, to form an overhang 1410. This overhang helps to prevent unwanted electrical bridging between the HIS and stainless steel when the assembly is soldered, or when the coil is "solder potted" as described below. Alternatively, an insulating tape which is narrower than the stainless steel may be provided, and aligned with one edge of the stainless steel (to provide a "lane" on the other edge).

Where the partially insulating layer has windows in other arrangements, solder may be provided during assembly of the partially insulating layer to ensure electrical connection between the HTS tape and the steel tape—for example where the windows would not permit fluid communication to the outer edges of the partially insulating layer. Alternatively or additionally, further metal inserts within the windows or protrusions in the metal layer may be used, as described previously.

Figure 15:
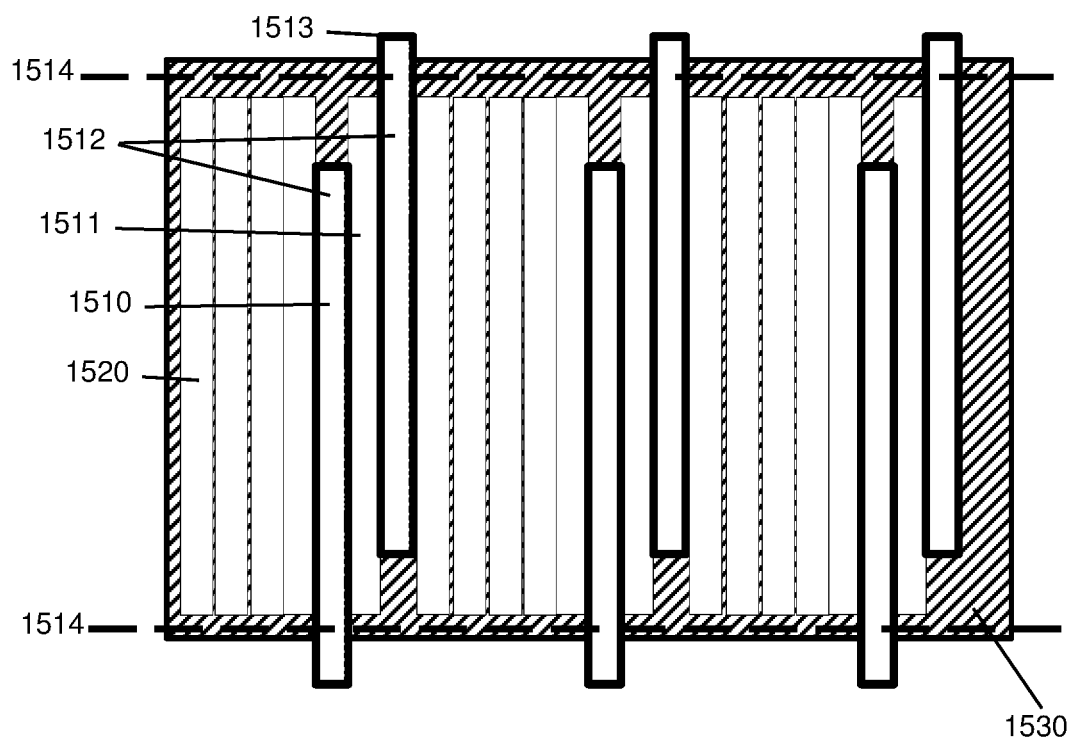
FIG. 15 shows an exemplary solder potted coil.

In order to both consolidate the coil and provide improved electrical connection, the coil may be "solder potted" or "consolidated with solder"—i.e. coated completely in solder, which is allowed to penetrate the coil (by analogy with "epoxy potting" as well known in the art). FIG. 15 shows an exemplary solder potted coil. The coil comprises a partially insulating layer 1510 and an HTS cable 1520. The partially insulating layer 1510 comprises a metal strip 1511 and insulating coatings 1512, where the insulating coatings have an overhang 1513 which protrudes beyond the edges of the coil. When the coil is solder potted, the solder 1530 will coat the surfaces of the coil and extend between the HTS tapes of the cable, thereby ensuring electrical connection between the HTS tapes of the cable and between the HTS cable and the metal layer. The metal surfaces of the HTS tapes and the exposed metal surfaces of the partially insulating layer may be treated with flux prior to soldering.

The coil may then be machined along the planes 1514 (dotted lines), to cut off the overhangs and smooth out the solder, which further ensures that no solder bridges across the overhangs remain.

Where the partially insulating layer is provided with an insulating coating on the edges instead of overhangs (e.g. as shown in FIG. 11 and described above), the coil may be machined down to this insulating coating following solder potting. If the solder used does not wet the insulating coating used, then such bridges may not form if the insulating coating on the edge is sufficiently wide.

As an alternative to providing overhangs on one side of the coil, that side of the coil may be coated in a removable mask (e.g. two-component silicone) which prevents the solder from bridging connections on that side. This arrangement makes alignment of the coil easier, as all of the HTS tapes and the partially insulating layer can be arranged with one end lying on a common plane.

While solder potting is shown for the "lanes" embodiment, it is equally applicable to the other constructions presented previously. In some cases, overhangs 1513 may be provided on both sides of each insulating coating, or along only parts of the length of the partially insulating layer, i.e. where connections across the insulating layer are undesirable, with no overhang where such connections are acceptable (such as where a window extends to the edge of the metal layer). If the windows in the insulating coatings are positioned such that they are not in fluid communication with the outside of the coil, then a separate soldering stage during winding may be performed to solder connections through these windows—or any of the other connection methods disclosed herein may be used instead (e.g. additional metal inserts within the windows).

Where the partially insulating layer is able to be electrically connected to the HTS tape by pressure alone (e.g. in the embodiments of FIGS. 11 and 12, and other embodiments in which part of the metal layer or components electrically connected to the metal layer are in the plane of the insulating coating), an electrical connection can be formed between the HIS and the partially insulating layer without solder potting or other soldering, though solder may still be used if desired. In this case the coil may be epoxy potted to improve the mechanical stability—though care should be taken to avoid epoxy blocking any of the electrical connections (either within the HTS cable or between the cable and the partially insulating layer).

The HTS cable may be soldered separately, either before winding or during the winding process. Soldering during winding may be achieved by coating each HTS tape in solder as it is unspooled, and passing them together through a heated roller to form the cable, which is then wound with the partially insulating layer.

Due to the small size of the gaps between the HTS cable and the metal layer in some embodiments, the solder may not wet these gaps during potting—this will depend on the composition of the solder, the metal layer, and the outer surface of the HTS cable. This will generally occur where the metal layer and the outer surface of the HTS cable are dissimilar. As such, in embodiments where electrical connection is not made by direct contact of the metal layer and HTS cable the metal layer and the outer surface of the HTS cable may be similar metals or these gaps may be soldered individually rather than via potting.

Similarly, the solder will not generally wet the gap between the insulating layer and the HTS tape. Following solder potting, the coil may be epoxy potted to consolidate these gaps (at least where they have fluid communication to the outside of the coil).

In some cases (e.g. when the partially insulating layer is manufactured as a flexible PCB) it may be desirable to create shorter lengths of partially insulating layer (e.g. 2 to 5 m) and connect them by butt joints within the coil. This should be considered as a single "partially insulating layer" in any of the above examples.

While the above disclosure has treated many of the variables equally, it will be appreciated that for a given magnet, the design process may constrain some variables and allow free choice in others. For example, where the required magnetic field and magnet geometry is known, the design process may include the following steps:

determining the required number of "amp-turns" (i.e. number of turns N multiplied by transport current I) to produce the required magnetic field.

selecting values I and N to provide an inductance L (dependent on N) and a radial resistance R (dependent on N and the turn-turn resistance $R_{TT}$) which will achieve an acceptable time constant (where "acceptable" will depend on the use case).

selecting properties of the partial insulation to provide the required $R_{TT}$.

The selection of I and $R_{TT}$ is likely to be constrained by other factors—e.g. the transport current cannot be above the critical current of the HTS cables, and $R_{TT}$ will depend on the acceptable thickness of the partially insulating layer and the width of the tapes (both of which are likely to be set by other considerations—e.g. space available and performance of HTS tapes).

While the above description is with reference to a wound pancake coil, similar considerations will apply to sectional coils. For such coils, the dependencies of L and R on coil parameters may be different, but can be ascertained by the skilled person using normal techniques of HTS magnet design.

The present disclosure allows use of non/partially-insulated coils by allowing the L/R time constant to be adjusted to give a good trade-off between acceptably fast coil ramp time and a long time window between a hot-spot forming in one turn and damage to the HTS tape occurring. This allows the hotspot to be detected by monitoring coil temperatures and, if necessary, active quench protection systems to be engaged to run down the magnet current in a longer timeframe compared to an equivalent insulated coil.

In addition, non-insulated coils require less copper or other metal stabilizer than equivalent insulated coils, as the copper can be "shared" between the HTS cables (i.e. the coil as a whole requires enough copper to share current from only a subset of the cables, rather than each HTS cable requiring enough copper to share current from that cable). Therefore, higher current densities can be achieved with partially-insulated coils, which is particularly useful in applications such as the toroidal field coil of a spherical tokamak, where the thickness of the coils is a significant design consideration (in the case of a spherical tokamak, to minimise the radius of the central column, or allow for more neutron shielding for a given central column radius).

If the behaviour of an insulated coil is desired for normal operation, the benefits of a non-insulated coil can still be obtained during a quench by the use of metal-insulator transition material such as vanadium oxide which have a very high resistance when cool, and a relatively low resistance (at least 10 times lower) when warmed above a transition temperature (approx. 110 K in the case of vanadium oxide). As such, a "semi-insulated" coil with a metal-insulator transition material between turns would behave as an insulated coil during normal operation and during ramp up (having a very low time constant), and as a non-insulated coil during a quench (which will cause the metal-insulator transition material to heat up and become conductive). This allows $R_T$ when the metal-insulator transition metal has low resistance to be made as low as possible without negatively impacting the ramp-up time constant (provided that $R_T$ at low temperatures provides a sufficiently low time constant, but this is easily achievable as metal-insulator transition materials have a very sharp drop in resistivity around their transition temperature, e.g. at least a 10 times fall in resistivity over 10 Kelvin, or even a $10^3$ times fall in resistivity over 10 Kelvin).

The above disclosure can be applied to a variety of HTS magnet systems. In addition to the tokamak fusion reactor mentioned above as an example, it may be used for HTS coils in nuclear magnetic resonance imaging (NMR/MRI) devices, manipulation of magnetic devices within a non-magnetic medium via magnetic fields (e.g. robotic magnetic navigation systems for manipulating medical devices within a patient), and magnets for electric motors, e.g. for electronic aircraft. As a further example, the disclosure may be applied to proton beam therapy devices comprising HTS magnet systems which include the disclosed features, where the HTS magnet systems are used within the accelerator of the PBT device, the quadrupole or dipole steering magnets of the PBT device, or any other magnet of the PBT device.

The invention claimed is:

1. A high temperature superconducting, HTS, field coil, the HTS field coil comprising:
   a plurality of turns comprising HTS material and metallic stabilizer;
   a partially insulating layer separating the turns, such that current can be shared between turns via the partially insulating layer;
   the partially insulating layer comprising:
      an electrically conducting layer coated on one side with a first insulating layer and on the other side with a second insulating layer;
      each insulating layer having one or more windows through which electrical contact can be made between the turns and the electrically conducting layer;
      wherein the windows in the first insulating layer are offset in the plane of the electrically conducting strip from the windows in the second insulating layer.

2. An HTS field coil according to claim 1, wherein the electrically conducting layer is a continuous electrically conducting strip.

3. An HTS field coil according to claim 1, wherein the electrically conducting layer comprises a plurality of regions, each region electrically connecting a respective first window in the first insulating layer to a respective second window in the second insulating layer, and each region being electrically insulated in the plane of the electrically conducting layer from the other regions.

4. An HTS field coil according to claim 3, wherein each region comprises a track between the first and second window, a length of the track between the first and second window being at least twice a width of the track measured perpendicular to the length.

5. An HTS field coil according to claim 4, wherein each track is non-linear.

6. An HTS field coil according to claim 1, wherein the windows in the second layer are each a part of a respective via extending through the first insulating layer, the second insulating layer, and the electrically conductive layer, the partially insulating layer further comprising an insulating cap on each via at the end proximate to the first insulating layer.

7. An HTS field coil according to claim 1, wherein the offset distance between each window on one layer and the closest window on the other layer is greater than a thickness of the electrically conducting layer.

8. An HTS field coil according to claim 1, wherein each insulating layer comprises a plurality of windows offset along a length of the partially insulating layer.

9. An HTS field coil according to claim 8, wherein
   the windows on each insulating layer are regularly spaced with a spacing that is the same for both insulating layers, and wherein each window has the same area, and/or
   wherein the windows on one insulating layer are offset from those in the opposing insulating layer such that each window on one insulating layer is equidistant from the two closest windows of the opposing insulating layer.

10. An HTS field coil according to claim 8, wherein the insulating layers are formed by:
    helically wrapping an insulating tape around the electrically conducting layer; or
    helically wrapping an insulating tape around the turns;
    such that gaps in the helical winding form the windows.

11. An HTS field coil according to claim 1, wherein each insulating layer comprises a single window extending along the length of the insulating layer, and the window on one insulating layer is offset along a width of the partially insulating layer from the window in the other insulating layer.

12. An HTS field coil according to claim 11, wherein the electrically conducting layer is bent such that the portion of the electrically conducting layer exposed by each window lies in the plane of the respective insulating layer.

13. An HTS field coil according to claim 1, wherein each insulating layer extends beyond the electrically conducting layer on at least one side.

14. An HTS field coil according to claim 1, wherein:
    the partially insulating layer comprises electrically conducting inserts in each windows;
    each window is plated with an electrically conducting material; and/or
    the electrically conducting layer comprises electrically conducting protrusions which extend into each window; and
    the electrically conducting inserts or protrusions fill the respective window; or the electrically conducting inserts or protrusions fill only a portion of the respective window, and electrical contact between the electrically conducting layer and the turns through the window is only via the electrically conducting inserts.

15. An HTS field coil according to claim 1, wherein the partially insulating layer comprises electrically conducting connection strips located outside the insulating layers and electrically connected to the electrically conducting strip via the windows, wherein the electrically conducting connection strips are electrically connected to the adjacent turns.

16. An HTS field coil according to claim 1, wherein the partially insulating layer comprises a plurality of sections connected by butt joints.

17. A method of manufacturing an HTS field coil, the method comprising:

provoiding an HTS cable, the HTS cable comprising HTS material and metallic stabiliser;

providing a partially insulating layer, the partially insulating layer comprising:

an electrically conducting layer coated on one side with a first insulating layer and on the other side with a second insulating layer;

each insulating layer having one or more windows through which electrical contact can be made between the turns and the electrically conducting layer;

wherein the windows in the first insulating layer are offset in the plane of the electrically conducting layer from the windows in the second insulating layer; and assembling the HTS cable and the partially insulating layer together to form an HTS field coil, such that current can be shared between turns of the HTS cable via the partially insulating layer.

18. A method according to claim 17, wherein providing the partially insulating layer comprises separately providing each of the electrically conducting layer and, insulating layers, and forming the partially insulating layer during winding of the HTS coil.

19. A method according to claim 18, wherein forming the partially insulating layer during winding of the coil comprises attaching the insulating layers to the electrically conducting layer with epoxy and curing the epoxy by the use of heated pressure rollers immediately before winding the partially insulating layer into the coil.

20. A method according to claim 17, wherein providing the partially insulating layer comprises:

bonding the insulating layers to the electrically conducting layer by adhesive; and etching the insulating layers to form the windows.

21. A method according to claim 17, wherein providing the partially insulating layer comprises:

providing a first insulating layer;

coating a surface of the first insulating layer with the electrically conductive layer;

attaching a second insulating layer to the electrically conducting layer; and drilling the windows in the first and second insulating layer.

22. A method according to claim 17, and comprising solder potting the HTS field coil.

23. A method according to claim 22, wherein at least one of the partially insulating layers has an overhang which extends beyond the electrically conducting layer on at least one side, and comprising, following the step of solder potting, machining that side of the HTS coil to a level such that at least a portion of the overhang is removed.

24. A method according to claim 22, and comprising, prior to solder potting, applying a removable mask to one side of the HTS coil, and removing the mask following solder potting.

25. A tokamak fusion reactor comprising an HTS field coil according to claim 1, wherein the HTS field coil is one of a toroidal field coil or a poloidal field coil.

26. A proton beam therapy, PBT, device comprising an HTS field coil according to claim 1, wherein the HTS field coil is one of:

a field coil of an accelerator of the PBT device; or a dipole or quadrupole magnet of a proton beam steering system of the PBT device.

* * * * *